United States Patent [19]

Gruszka

[11] 3,809,233

[45] May 7, 1974

[54] METHOD OF AND PACKAGE FOR TRANSPORTING ARTICLES

[75] Inventor: Raymond Frank Gruszka, Reading, Pa.

[73] Assignee: Western Electric Company Incorporated, New York, N.Y.

[22] Filed: July 14, 1972

[21] Appl. No.: 271,882

Related U.S. Application Data

[63] Continuation-in-part of Ser. No. 112,263, Feb. 3, 1971, abandoned.

[52] U.S. Cl. .................... 206/328, 53/37, 174/35 R, 206/461, 206/818, 317/101 R, 335/285

[51] Int. Cl. .... B65d 73/02, B65b 15/02, H01f 7/20

[58] Field of Search ......... 206/65 F, 80 A, DIG. 33; 40/142 A; 335/285, 303; 53/21 FC, 37; 269/7, 8

[56] References Cited

UNITED STATES PATENTS

| | | | |
|---|---|---|---|
| 3,195,022 | 7/1965 | Staver | 335/285 |
| 3,093,919 | 6/1963 | Holtz | 40/142 A |
| 2,677,910 | 5/1954 | Morgan | 40/142 A UX |
| 3,102,048 | 8/1963 | Gran et al. | 40/142 A UX |
| 2,855,735 | 10/1958 | Groth | 53/22 A |
| 3,312,340 | 4/1967 | Face | 206/80 A |

*Primary Examiner*—Leonard Summer
*Attorney, Agent, or Firm*—R. Y. Peters

[57] ABSTRACT

Integrated circuits are arrayed on a carrier of permanently magnetized material, such as barium ferrite. The circuits may be plated with a layer of magnetic material. A thin foil cover of magnetic soft material is placed over the array of circuits to hold the circuits in the array and enclose them. Where the circuits are to be transported through fluids, the cover is made porous to admit the fluids. A convenient protective package is thereby provided for transporting the integrated circuits.

20 Claims, 6 Drawing Figures

METHOD OF AND PACKAGE FOR TRANSPORTING ARTICLES

CROSS REFERENCE

This application is a continuation-in-part of copending application Ser. No. 112,263, filed Feb. 3, 1971, now abandoned.

BACKGROUND OF THE INVENTION

1. Field of the Invention

The invention relates to a method of and a package for transporting articles. More particularly, the invention relates to a method of and package for transporting an array of integrated circuits.

2. Description of the Prior Art

In order to efficiently and automatically process integrated circuits, in the past they have been waxed to a support or carrier in a precise array. Since the circuits were waxed to the support, the support had to be heated in order to remove the integrated circuits. This is inconvenient and some wax tends to cling to the integrated circuits, thus interferring with subsequent manufacturing operations; for example, bonding.

The waxing procedure was used because it firmly fastened the integrated circuits to the support or carrier and, thus, maintained the accuracy with which the circuits were arrayed on the support or carrier. The removal of the integrated circuits from the support by automatic indexing equipment depends upon the accuracy of this array. The inconvenience of removing the integrated circuits from the wax makes it highly desirable to utilize where possible some other form of retaining the circuits on their support or carrier. Further, it is desirable that the integrated circuits, which are extremely small and fragile, be protected from contact by or the influence of deleterious external objects or substances during transportation of the circuits.

The invention described herein provides a method of and package for transporting integrated circuits which minimizes the inconvenience of the wax and provides the essential protection against external influence, such as, contamination, physical damage or the like.

SUMMARY OF THE INVENTION

In accordance with the present invention inactive sides of a plurality of integrated circuits are faced with a magnetic material. The circuits are arrayed on a permanently magnetized carrier or support and are retained, at least, temporarily, in the array by attraction to the magnetized support.

A thin magnetic foil, coextensive with the support, is placed over the integrated circuits. The foil, like the circuits, is attracted to the support and is drawn down, at least partially, into the interstices between the integrated circuits in the array. Thus, the foil not only prevents the integrated circuits from shifting in the array but covers the circuits to protect them from external influences.

Where adhesive must be removed, the cover is made porous to permit vapors and liquids to penetrate to the integrated circuits and dissolve the adhesive or cement. Thus, the circuits are maintained in their original position even though the adhesive is removed and they are disengaged from the support.

Accordingly, it is an object of the invention to provide a method and means for transporting integrated circuits in an array.

It is a further object of the invention to provide a method and means for protecting the integrated circuits from contamination, physical damage or the like.

BRIEF DESCRIPTION OF THE DRAWINGS

The invention may be understood best with reference to the following description and drawings in which.

DESCRIPTION OF PREFERRED EMBODIMENT

Figure 1:
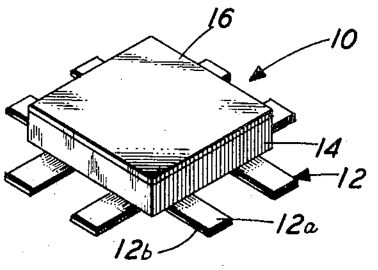
FIG. 1 shows an isometric view of a typical integrated circuit with plating added.

Referring now to FIG. 1, there is shown a typical beam-lead integrated circuit 10. The beam leads 12—12 are connected to active elements of the circuit formed on the active side of the chip 14 and protrude beyond the edge of the chip. The leads 12—12 typically are plated gold about 0.5 mil thick by 3 mils wide and extend beyond the chip about 6 mils. The chips range in size from 20 × 20 mils to 60 × 60 mils and are typically silicon which is nonmagnetic.

The inactive side of the chip 14 is plated with a layer 16 of magnetic material to make the chip respond to the influence of a magnetic field, i.e., to make the chip magnetic. Preferably the magnetic material is magnetically soft, and therefore characterized by high permeability and low coercive force, so that the material is strongly attracted by a magnetic field but has little remanent magnetism when removed from the field and does not become permanently magnetized. Materials characterized by high permeability (initial permeability, 2,500 to 100,000; maximum permeability, 25,000 to 800,000) and low coercive force (0.004 to 0.3) are the alloys of iron and primarily 45 to 80 percent nickel. These are sold under such trademarks as Permalloy and Hypernik.

An alternative to plating the inactive side of the device may be provided by making the leads 12—12 a combination of a layer of magnetically soft material and a layer of gold. Referring to FIG. 1, one lead 12 is shown, for illustrative purposes, with a first layer **12*a* of magnetically soft material and a second layer 12*b*** of gold.

Figure 2:
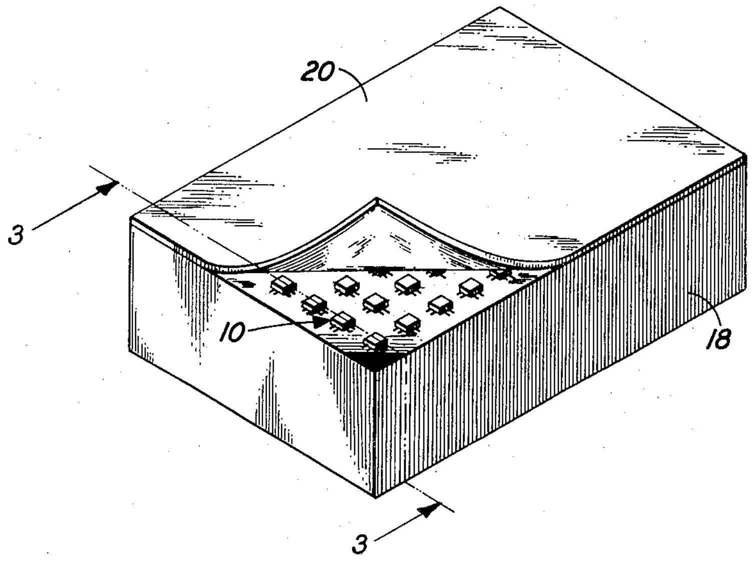
FIG. 2 shows an isometric view of an array of integrated circuits packaged for transportation, with one corner of the foil lifted.

Referring now to FIG. 2, the integrated circuits 10—10 are arrayed on a permanently magentized carrier or support 18 with the leads 12—12 against the support 18 to facilitate subsequent bonding. However, the circuits 10—10 may be arrayed on the support 18 with the magnetic layer 16 against the support.

Preferably the support 18 is a magnetically hard material which may be permanently and strongly magnetized. The magnetically hard materials are characterized by high coercive force and may be permanent magnet materials such as barium ferrite or the alnico series of alloys. However, it is not the intention to limit the invention to just these particular magnetically hard materials.

A magnetic cover 20, which is coextensive with the support 18, is placed over the array of integrated circuits 10—10. The cover 20 is preferably made of magnetically soft foil because of its high permeability, low coercive force and low remanence. Generally, although not always, it is preferable to make the cover 20 magnetically soft to avoid sticking of the circuits 10—10 to the cover when it is subsequently removed. Also it is preferable that the cover 20 be approximately 0.0001 of an inch thick, but may be thicker if desired, so that it exhibits some flexibility in order to contact and restrain each of the circuits 10—10.

Figure 3:
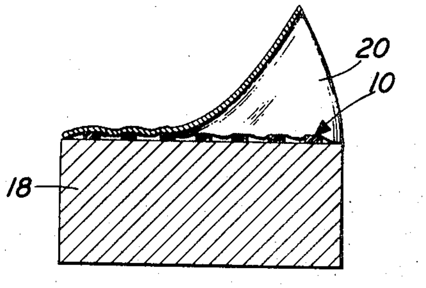
FIG. 3 is a cross section of FIG. 2 taken along the line 3—3, showing the foil drawn between the interstices of the integrated circuits in the array.

Under the attraction of the magnetic field the cover 20 tends to be drawn to the support 18 between the integrated circuits 10—10 as shown in FIG. 3. This partially forms the cover 20 around the integrated circuits 10—10 to prevent sideways shifting of the circuits in any direction. Of course, the downward force exerted by the cover 20 contributes substantially to retaining the integrated circuits on the support 18.

In addition to holding the integrated circuits 10—10 on the support 18, the cover 20 acts as protection which excludes any direct contact between external objects and the integrated circuits, and thereby reduces the likelihood of physical damage to the integrated circuits. It also prevents contact by dirt and dust from the atmosphere. The combination of the support 18 and the cover 20, therefore, provides a reuseable package suitable for transporting and protecting integrated circuits both between manufacturing operations and the manufacturer and his customer.

Figure 4:
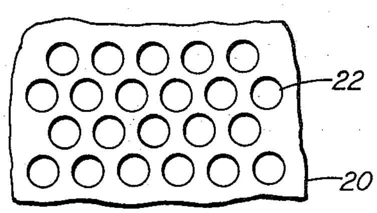
FIG. 4 is a partial plan view of a round-hole, porous cover.
Figure 5:
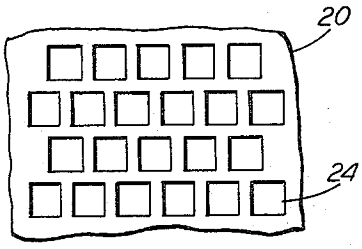
FIG. 5 is a partial plan view of a square-hole, porous cover.

Another version of this package is extremely advantageous where the elimination of the use of wax to cement the circuits 10—10 to a carrier is not possible. In this case a slice of semiconductor material containing an array of the circuits 10—10 is cemented with wax to the permanently magnetized carrier or support 18 and after manufacturing operations are performed to separate the slice into the individual circuits, is transported through trichlorethylene, to dissolve the wax. However, the wax must be removed in such a way as to disengage the circuits 10—10 from the support 18 without disturbing their position in the array on the support. To do this, they are overlaid with the cover 20 which is made porous by perforating it. The holes may be round holes 22—22, 5 to 30 mils in diameter on 7 to 30 mil centers, as in FIG. 4, or square holes 24—24, 3 to 30 mils on a side on 5 to 30 mil centers, as in FIG. 5. The hole size is chosen to be as large as possible and still be small enough to retain the circuits 10—10.

Figure 6:
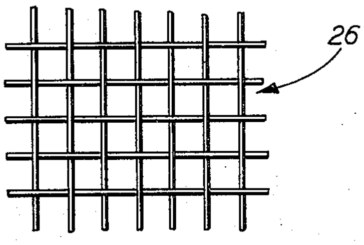
FIG. 6 is a partial plan view of a wire mesh cover.

The cover material may be: approximately 0.0001 of an inch thick Permalloy as previously indicated for the unperforated cover; 1 mil thick magnetic stainless steel; or a nickel screen, e.g., 0.002 of an inch wire woven into a 200 mesh screen as shown in FIG. 6, with openings smaller than the integrated circuits to be retained on the carrier. Whatever material is chosen for the cover 20, the package may be placed in either the vapor or liquid phase portions of a trichlorethylene degreaser; an apparatus well known in the art. Preferably, the package is placed in the vapor phase so that the trichlorethylene vapor easily penetrates the perforations in the covers, condenses, dissolves the wax, and drains off carrying the wax away. Liquid trichlorethylene wax removal is disclosed in the W. R. Wanesky U.S. Pat. No. 3,643,326. Even though the integrated circuits 10—10 are now free of the magnetic support 18, they are still retained by the porous cover in precisely their original position from which they may be removed by automatic machines.

Such a package not only retains the precision of the array of integrated circuits 10—10 but offers the advantage of easy removal of the circuits from the package by automatic equipment and environmental protection during transportation.

While there has been described and illustrated herein practical embodiments of the present invention, it is to be understood that various modifications and refinements which depart from the disclosed embodiment may be adopted without departing from the spirit and scope of the present invention.

What is claimed is:

1. A method of packaging an article, which comprises the steps of:

a. positioning the article on a magnetized carrier; and b. placing a cover over the article, the cover being larger than the article to be packaged and of continuous magnetic foil so that it is drawn down to at least partially form around the article to maintain the position of and protect the article on the carrier.

2. The method as recited in claim 1, wherein the article is magnetic.

3. The method as recited in claim 1, wherein the cover is magnetically soft.

4. A method of packaging as recited in claim 1, wherein a portion of the article is coated with a magnetic material.

5. A method of packaging as recited in claim 4, wherein both the magnetic cover and the magnetic material are magnetically soft.

6. A method of packaging an array of integrated circuits, the integrated circuits having an active element side on which the circuits are formed and an inactive side, which comprises the steps of:

a. plating said inactive side with high permeability alloy to make the circuits capable of attraction by a magnetic field;

b. placing the integrated circuits in an array on a permanently magnetized carrier; and c. placing a thin magnetically soft foil over the array of integrated circuits, said foil being coextensive with the magnetized carrier and drawn toward the carrier so that the foil engages the circuits, prevents the circuits from sideways shifting during transportation and protects said circuits in the array during transportation.

7. A package for transporting an article which comprises:

a. a magnetized carrier for holding the article; and b. a cover placed over the article, said cover being foil larger than the article to be transported and magnetic over its continuum and attracted to the carrier at all points so that the portion of the cover not supported by the article is drawn in proximity to the carrier and partially formed around the article, for restraining said article against movement and protecting the article.

8. A package for transporting an article as recited in claim 7, wherein the carrier is barium ferrite magnetized transversely to its support surface.

9. A package for transporting an article as recited in claim 8, wherein the cover is a magnetically soft foil.

10. A protective package for transporting an array of integrated circuits plated with a magnetic alloy, which comprises:

a. a barium ferrite carrier, having a plane support surface and magnetized transversely to said surface, for attracting and holding the integrated circuits thereon; and b. a thin, magnetically soft, foil cover placed over said integrated circuits and coextensive with the carrier so that the cover is attracted to the carrier to aid in maintaining the integrated circuits in said array and to protect the circuits during transportation.

11. A method of packaging articles, which comprises the steps of:

positioning the articles on a magnetized carrier; and placing a porous magnetic cover over the articles to maintain their position and permit penetration of fluids to the articles on the carrier.

12. A method of packaging as recited in claim 11, wherein the porous magnetic cover is a perforated sheet of magnetic material.

13. A method of packaging as recited in claim 12, wherein the sheet is magnetically soft.

14. A method of packaging as recited in claim 13, wherein the sheet is Permalloy.

15. A method of packaging as recited in claim 11, wherein the porous magnetic cover is a nickel screen.

16. A package for transporting an array of articles, cemented with an adhesive to a carrier, during and after an operation to remove the adhesive with a solvent, which comprises:

a magnetized carrier, having a plane support surface and being magnetized transversely to said surface, for holding the articles; and a porous magnetic cover, placed over said articles and coextensive with the carrier, the cover being porous to permit the penetration of solvent to dissolve the adhesive and magnetic to be attracted to the carrier to aid in maintaining the articles in the array.

17. A package as recited in claim 16, wherein the articles are integrated circuits plated on one side with a magnetic alloy.

18. A package as recited in claim 17, wherein the adhesive is wax and the solvent is trichlorethylene.

19. A package as recited in claim 18, wherein the porous magnetic cover is perforated Permalloy sheet.

20. A package as recited in claim 18, wherein the porous magnetic cover is a nickel screen.

* * * * *